US011467477B2

(12) United States Patent
Tian et al.

(10) Patent No.: US 11,467,477 B2
(45) Date of Patent: Oct. 11, 2022

(54) LASER ARRAY, LASER SOURCE AND LASER PROJECTION DEVICE

(71) Applicant: HISENSE LASER DISPLAY CO., LTD., Qingdao (CN)

(72) Inventors: Youliang Tian, Qingdao (CN); Wei Li, Qingdao (CN); Zinan Zhou, Qingdao (CN)

(73) Assignee: HISENSE LASER DISPLAY CO., LTD., Qingdao (CN)

(*) Notice: Subject to any disclaimer, the term of this patent is extended or adjusted under 35 U.S.C. 154(b) by 387 days.

(21) Appl. No.: 16/708,406

(22) Filed: Dec. 9, 2019

(65) Prior Publication Data

US 2020/0201161 A1 Jun. 25, 2020

Related U.S. Application Data

(63) Continuation of application No. PCT/CN2019/084117, filed on Apr. 24, 2019.

(30) Foreign Application Priority Data

Sep. 19, 2018 (CN) .................. CN201811095963
Sep. 19, 2018 (CN) .................. CN201811095967
(Continued)

(51) Int. Cl.
*H01S 5/40* (2006.01)
*G03B 21/20* (2006.01)
(Continued)

(52) U.S. Cl.
CPC ..... *G03B 21/2033* (2013.01); *G02B 19/0057* (2013.01); *H01S 5/0085* (2013.01);
(Continued)

(58) Field of Classification Search
CPC ............ G03B 21/2033; G02B 19/0057; H01S 5/0085; H01S 5/02257; H01S 5/4012;
(Continued)

(56) References Cited

U.S. PATENT DOCUMENTS 5,533,152 A   7/1996 Kessler
2012/0019783 A1   1/2012 Imai
(Continued)

FOREIGN PATENT DOCUMENTS

CN   1530590 A   9/2004
CN   1532590 A   9/2004
(Continued)

OTHER PUBLICATIONS

Machine translation of WO2017017864A1 (Year: 2017).*
(Continued)

*Primary Examiner* — Yuanda Zhang
(74) *Attorney, Agent, or Firm* — J.C. Patents

(57) ABSTRACT

Embodiments of the present disclosure provide a laser array, a laser source, and a laser projection device, and relate to the field of laser display technologies. The laser array includes a light emitting portion for emitting a laser light beam; a light transmitting portion disposed along a light emitting direction of the light emitting portion for transmitting the laser light beam; where the light transmitting portion includes a first light transmitting region and a second light transmitting region, the first light transmitting region and the second light transmitting region are disposed such that light beams transmitting through the two regions have different polarization directions, which can reduce coherence of the laser light beam emitted from the laser array, thereby facilitating elimination of a speckle.

15 Claims, 15 Drawing Sheets

(30) Foreign Application Priority Data

Sep. 19, 2018 (CN) .................. CN201811095997
Sep. 19, 2018 (CN) .................. CN201811118508

(51) Int. Cl.
*H04N 9/31* (2006.01)
*H01S 5/02257* (2021.01)
*H01S 5/00* (2006.01)
*G02B 19/00* (2006.01)

(52) U.S. Cl.
CPC ........ *H01S 5/02257* (2021.01); *H01S 5/4012* (2013.01); *H01S 5/4025* (2013.01); *H01S 5/4093* (2013.01); *H04N 9/312* (2013.01); *H04N 9/3161* (2013.01)

(58) Field of Classification Search
CPC ..... H01S 5/4025; H01S 5/4093; H04N 9/312; H04N 9/3161
See application file for complete search history.

(56) References Cited

U.S. PATENT DOCUMENTS

| | | | | |
|---|---|---|---|---|
| 2012/0062848 | A1* | 3/2012 | Koyanagi | G02B 27/286 353/20 |
| 2014/0036943 | A1* | 2/2014 | Janssens | G02B 27/283 372/27 |

FOREIGN PATENT DOCUMENTS

| | | | |
|---|---|---|---|
| CN | 1975467 | A | 6/2007 |
| CN | 101140413 | A | 3/2008 |
| CN | 101359100 | A | 2/2009 |
| CN | 101419341 | A | 4/2009 |
| CN | 102253500 | A | 11/2011 |
| CN | 102402015 | A | 4/2012 |
| CN | 103048268 | A | 4/2013 |
| CN | 103207508 | A | 7/2013 |
| CN | 103376636 | A | 10/2013 |
| CN | 103946737 | A | 7/2014 |
| CN | 104220922 | A | 12/2014 |
| CN | 105182674 | A | 12/2015 |
| CN | 205049852 | U | 2/2016 |
| CN | 107178711 | A | 9/2017 |
| CN | 107229173 | A | 10/2017 |
| CN | 107275463 | A | 10/2017 |
| CN | 206585194 | U | 10/2017 |
| CN | 107505807 | A | 12/2017 |
| CN | 107850827 | A | 3/2018 |
| CN | 107980182 | A | 5/2018 |
| CN | 207457625 | U | 6/2018 |
| CN | 110928118 | A | 3/2020 |
| CN | 110928119 | A | 3/2020 |
| CN | 110928120 | A | 3/2020 |
| JP | 2002062582 | A | 2/2002 |
| JP | 2008064794 | A | 3/2008 |
| JP | 2009294249 | A | 12/2009 |
| JP | 2010160307 | A | 7/2010 |
| JP | 2011175213 | A | 9/2011 |
| JP | 2016103575 | A | 6/2016 |
| WO | WO-2017017864 | A1 * | 2/2017 ............... F21S 2/00 |

OTHER PUBLICATIONS

First Office Action of the priority CN2018111185086.
First Office Action of the priority CN2018110959978.
First Office Action of the priority CN2018110959677.
First Office Action of the priority CN2018110959639.
The Chinese International Search Report of corresponding International application No. PCT/CN2019/084117, dated Jul. 29, 2019.
Second Office Action of the priority application CN2018111185086.

* cited by examiner

US 11,467,477 B2

LASER ARRAY, LASER SOURCE AND LASER PROJECTION DEVICE

CROSS-REFERENCE TO RELATED APPLICATIONS

This disclosure is a continuation application of International Patent Application No. PCT/CN2019/084117, filed on Apr. 24, 2019, which claims priority to Chinese Patent Application No. 201811095997.8, filed on Sep. 19, 2018, and entitled "LASER ARRAY, LASER SOURCE AND LASER PROJECTION DEVICE", Chinese Patent Application No. 201811095963.9, filed on Sep. 19, 2018, Chinese Patent Application No. 201811118508.6, filed on Sep. 19, 2018, Chinese Patent Application No. 201811095967.7, filed on Sep. 19, 2018, the contents of all the above applications are hereby incorporated by reference in their entireties.

TECHNICAL FIELD

The present disclosure relates to the fields of laser display technologies and in particular, to a laser array and a related laser source and a laser projection device.

BACKGROUND

In recent years, laser lights have been gradually used as light sources in the field of projection display technologies. However, due to a high coherence of the laser lights, a speckle effect is inevitably generated. The so-called speckle means that when a coherent light source irradiates a rough object, scattered lights generate interference in space due to the same wavelength and a constant phase. In the space, some parts of the scattered lights undergo interference construction, and some undergo interference cancellation, and finally particle-like bright and dark spots appear on a display end, resulting in a decrease in a quality of a projected image.

SUMMARY

In one aspect, a laser array is provided. The laser array comprises a light emitting portion emitting a laser light beam; a light transmitting portion disposed along a light emitting direction of the light emitting portion for transmitting the laser light beam; wherein the light transmitting portion comprises a first light transmitting region and a second light transmitting region, and light beams transmitting through the two regions have different polarization directions.

In another aspect, a laser source is provided. The laser light includes a laser array as described above and a convergence shaping member that converges and shapes a laser light beam emitted by the laser array to form a light beam.

In yet another aspect, a laser projection device is provided. The laser projection device includes a laser source described above, a light modulation device configured to receive the light beam from the laser source and modulate the light beam according to a driving signal corresponding to an image display signal; and a projection lens configured to receive the modulated light beam from the light modulation device to image.

BRIEF DESCRIPTION OF DRAWINGS

In order to more clearly illustrate embodiments of the present disclosure or technical solutions in the prior art, drawings used in description of the embodiments or the prior art will be briefly described below. Obviously, the drawings in the following description are some embodiments of the present disclosure, and other drawings can be obtained according to the drawings without any creative work for those skilled in the art.

DESCRIPTION OF EMBODIMENTS

Technical solutions in embodiments of the present disclosure are clearly and completely described in the following with reference to the drawings in the embodiments of the present disclosure. Obviously, the described embodiments are only a part of the embodiments of the present disclosure, but not all of the embodiments. All other embodiments obtained by a person of ordinary skill in the art based on the embodiments of the present disclosure without paying any creative work belong to the protection scope of the present disclosure.

Throughout the specification and claims, terms may have nuanced meanings suggested or implied in context beyond an explicitly stated meaning. Likewise, the phrase "in one embodiment" or "in some embodiments" as used herein does not necessarily refer to the same embodiment and the phrase "in another embodiment" or "in other embodiments" as used herein does not necessarily refer to a different embodiment. Similarly, the phrase "in one implementation" or "in some implementations" as used herein does not necessarily refer to the same embodiment and the phrase "in another implementation" or "in other implementations" as used herein does not necessarily refer to a different implementation. It is intended, for example, that claimed subject matter includes combinations of exemplary embodiments or implementations in whole or in part.

In general, terminology may be understood at least in part from usage in context. For example, terms, such as "and", "or", or "and/or", as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. "And/or" if used to associate a list, such as "A and/or B", should be understood to mean only A, only B, or A and B. That is, "A and/or B" comprises three relationships. In addition, the term "one or more" or "at least one" as used herein, depending at least in part upon context, may be used to describe any feature, structure, or characteristic in a singular sense or may be used to describe combinations of features, structures or characteristics in a plural sense. Typically, "at least one" if used to associate a list, such as "at least one of A and B", should be understood to mean "only A, only B, or both A and B". Similarly, terms, such as "a", "an", or "the", again, may be understood to convey a singular usage or to convey a plural usage, depending at least in part upon context. In addition, the term "based on" or "determined by" may be understood as not necessarily intended to convey an exclusive set of factors and may, instead, allow for existence of additional factors not necessarily expressly described, again, depending at least in part on context.

Figure 1:
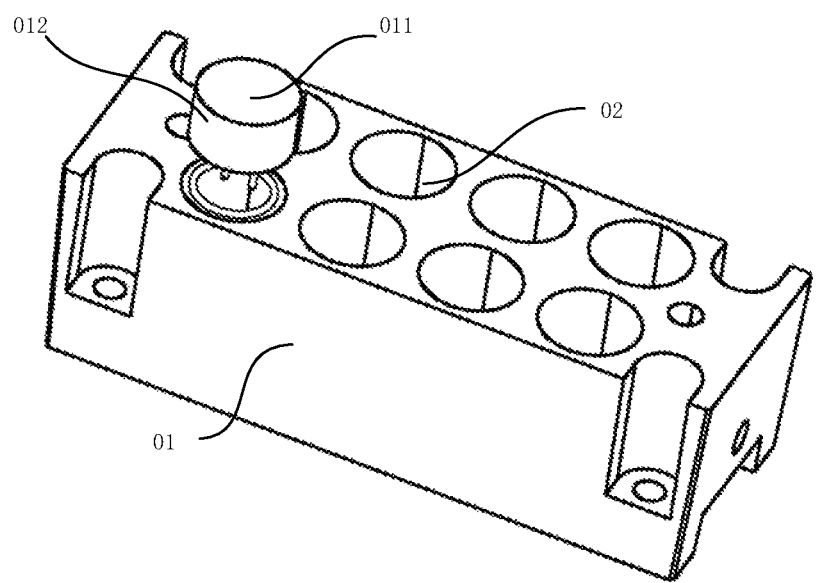
FIG. 1 is a structural diagram of a laser array.

FIG. 1 is a schematic structural diagram of a laser array, as shown in FIG. 1, the laser array includes a metal bracket 01 with a plurality of grooves 02, each of the grooves 02 contains a laser light emitting chip 012 and a collimating lens 011, the laser light emitting chip 012 and the collimating lens 011 shown in FIG. 1 are packaged together and accommodated in the groove 02. The laser light beam emitted by the laser array enters an optical path, and then is converged and shaped to irradiate to a light modulation device in an optical machine, and is modulated and then emitted. In general, when the above laser array is used as a light source, it is necessary to provide a speckle eliminating component in the optical path to reduce a speckle effect.

However, disposing the speckle eliminating component in the optical path increases a complexity of the optical path, and an elimination effect of the speckle is also related to an optical processing efficiency of an optical path design, which greatly restricts solution of a speckle eliminating problem of an entire optical system. Therefore, in order to solve the problems existing in reducing the speckle effect, the present disclosure provides a laser array, a laser source, and a laser projection device.

Figure 2A:
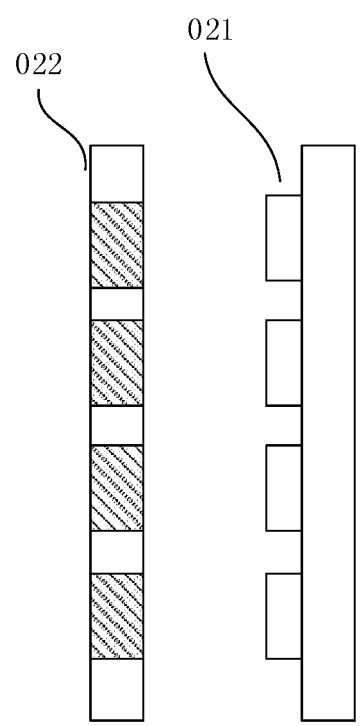
FIG. 2A is a schematic cross-sectional diagram of a laser array.
Figure 3A:
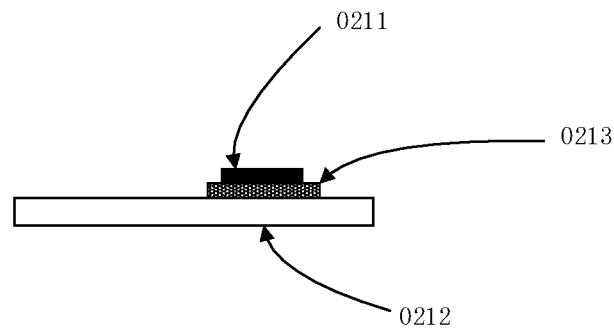
FIG. 3A is a schematic cross-sectional view of a light emitting portion of the laser array of FIG. 2A.

In some embodiments, as shown in FIG. 2A, the laser array includes a light emitting portion 021 for emitting a laser light beam, and a light transmitting portion 022 disposed along a light emitting direction of the light emitting portion 021 for transmitting the laser light beam. Specifically, as shown in FIG. 3A, the light emitting portion 021 includes a light emitting chip 0211, a metal substrate 0212, and the light emitting chip 0211 is fixed to the metal substrate 0212. The light emitting chip 0211 emits a laser light beam under electric driving, where the laser light beam may be a linearly polarized light.

The light transmitting portion 022 includes a first light transmitting region and a second light transmitting region, the first light transmitting region and the second light transmitting region are disposed such that the light beams transmitted through the two regions have different polarization directions. In one implementation, the first light transmitting region and the second light transmitting region of the light transmitting portion 022 are disposed such that polarization directions of the light beams transmitted through the two regions are orthogonal. Optionally, one of the first light transmitting region and the second light transmitting region is provided with a polarity conversion component.

Alternatively, in another specific implementation, the first light transmitting region and the second light transmitting region are disposed such that light beams transmitted through the two regions are a linearly polarized light and a circularly polarized light, respectively.

Figure 5:
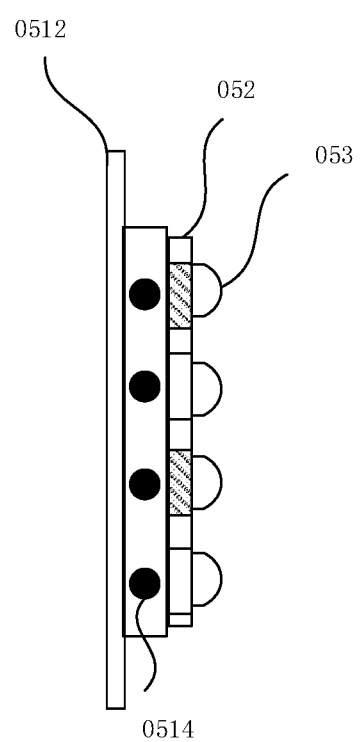
FIG. 5 is a schematic cross-sectional diagram of an assembled structure of a laser array.

Referring to FIG. 5, a light emitting chip (not shown) disposed on a metal substrate 0512 is configured to emit a laser light beam, and a light transmitting portion 052 disposed along a light emitting direction of the laser light beam is enclosed with the metal substrate 0512 to form a sealed space. The light emitting chip is sealed in the sealed space. The light transmitting portion 052 may be fixedly connected to the metal substrate 0512 by soldering or glass glue.

Figure 3B:
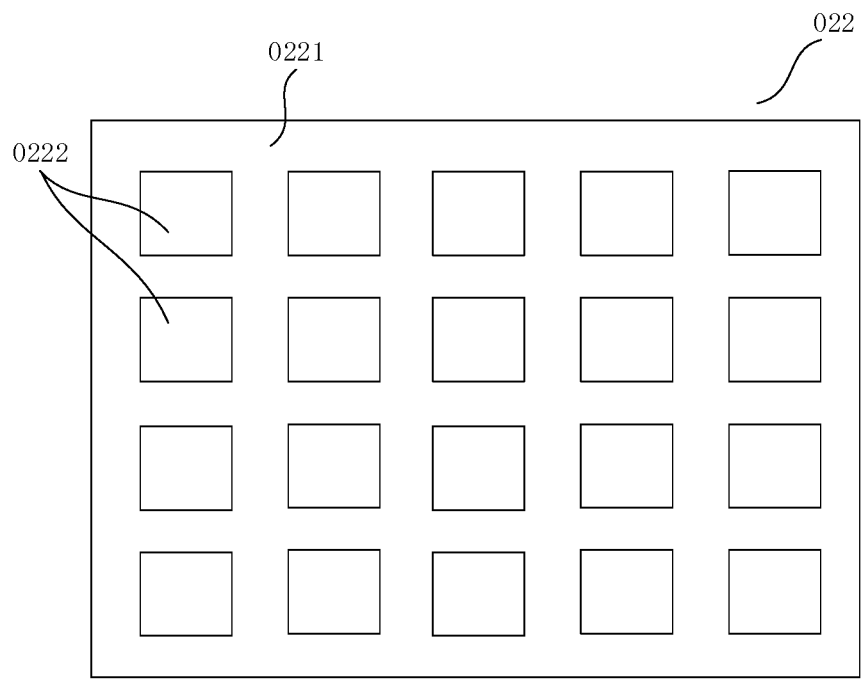
FIG. 3B is a schematic front view of a light transmitting portion of the laser array shown in FIG. 2A.

Referring to FIG. 2A, the light transmitting portion 022 is a light transmitting layer structure, and covers the light emitting side of the light emitting portion 021. In a specific implementation, as shown in FIG. 3B, the light transmitting portion 022 includes a window bracket 0221, and a plurality of hollowed windows 0222 are formed on the window bracket 0221 for bonding and accommodating a plurality of light transmitting units. In a specific implementation, the light transmitting units are light transmitting members having a curvature of zero for transmitting the laser light beams without causing a convergence and collimation effect on the laser light beams.

Figure 10A:
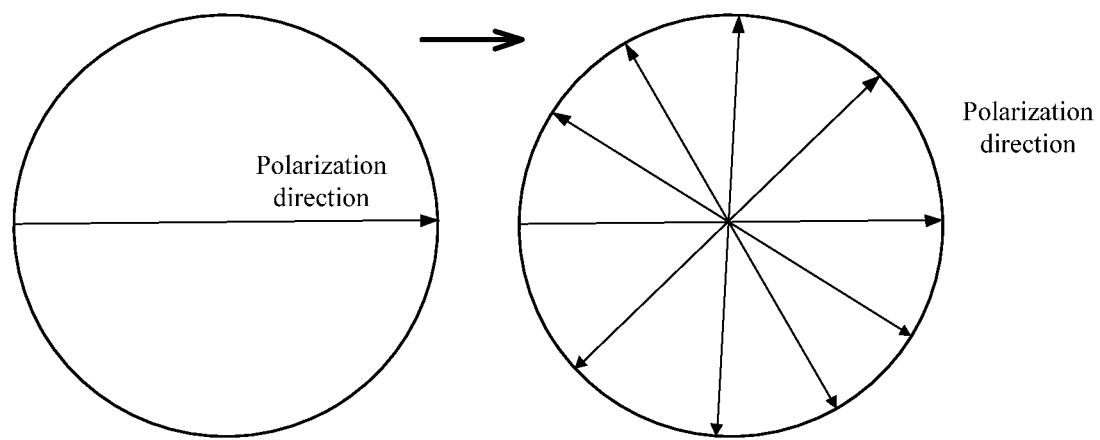
FIG. 10A is a schematic diagram of a laser light beam changing polarization direction.
Figure 10B:
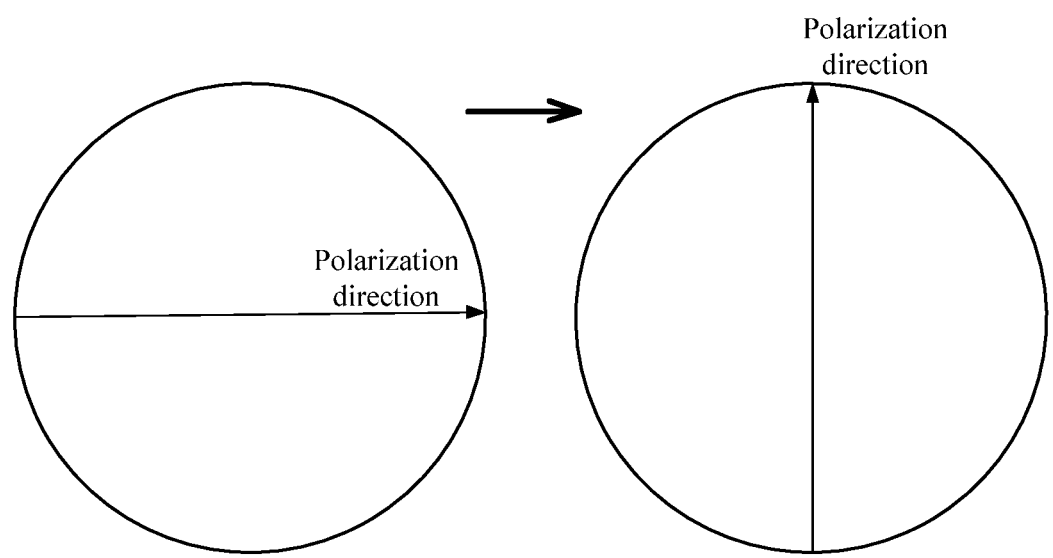
FIG. 10B is another schematic diagram of a laser light beam changing polarization direction.

Specifically, the plurality of light transmitting units may be fixedly adhered to the window frame 0221 by UV glass glue, and the plurality of light transmitting units (not shown) are classified into two kinds of regions according to the fact that whether a change occurs on a polarity of the transmitted laser light: a first light transmitting region and a second light transmitting region. Polarization directions of the laser light beams emitted by the light emitting portion 021 after passing through the first light transmitting region and the second light transmitting region are different. It is assumed that the incident laser light is a linear polarized light, and transmits through both the first light transmitting region and the second transmitting region. The output light from the first transmitting region is still the same linear polarized light with the incident light; while the output light of the second transmitting region changes from a linear polarized light to a circular polarized light after transmitting through the second transmitting region, as shown in FIG. 10A. In another example, the incident laser light is a P-polarized light, and transmits through both the first light transmitting region and the second transmitting region. The output light of the first light transmitting region has the same polarization with the incident light, which is still a P-polarized light; while the output light of the second light transmitting region changes from a P-polarized light to a S-polarized light after transmitting through the second transmitting region, which is perpendicular to and has a 90-degree inversion relationship with the incident light, as shown in FIG. 10B. In an implementation, one of the first light transmitting region and the second light transmitting region adopts a flat sheet glass, and the other adopts a quarter wave plate. The output laser light has the same linear polarization direction with the original incident light after transmitting through the light transmitting region with the flat sheet grass. In one example, the original incident light is a linearly polarized light, the linearly polarized light enters the quarter wave plate perpendicularly and the polarization direction of the linearly polarized light is at an angle of 45 degrees relative to an optical axis of the wave plate, a circular polarized light shown in FIG. 10A is produced. In this way, the circularly polarized light has a plurality of polarization directions, in which a plurality of polarization directions different from the original linearly polarized light exist. Since beams of light with different polarization directions become less coherent with each other, the laser array is capable of emitting laser light beams having low coherence, which is beneficial for reducing a speckle effect when a subsequent laser projection display is performed.

In another implementation, one of the first light transmitting region and the second light transmitting region adopts a flat sheet glass, and the other adopts a half wave plate. In this case, when the incident light transmits through both the first light transmitting region and the second light transmitting region, the output laser light of the light transmitting region with the flat sheet grass has the same linear polarization direction with the original incident light, while the laser light is reversed by 90 degrees in polarization direction after passing through the half wave plate to output a polarized light having a polarity different from the original incident light as shown in FIG. 10B. Two laser light beams that convert between a P-polarized light and an S-polarized light and whose polarization directions are perpendicular to each other can generate a superposition of two independent random patterns when entering the same scattering component (speckle eliminating member), thereby facilitating the reduction of the speckle effect. It can be considered that two laser light beams having the same frequency but different polarization directions are incoherent, so that coherence of the laser light beams emitted by the laser array is greatly reduced, and it is beneficial for weakening or eliminating the speckle effect.

In one implementation, according to the number of panes included in the first light transmitting region and the second light transmitting region, a plurality of flat glass, half wave plate or quarter wave plate components are disposed to be respectively adhered to the window of the window bracket of the light transmitting portion facing emitted light beams of the laser emitting chips, and the light transmitting portion is a pane-shaped light transmitting structure.

In another implementation, the light transmitting portion is an integral light transmitting structure, such as a light transmitting glass plate, and transmission characteristics of different regions are realized through region-by-region coating. For example, a partial coating can be performed to realize a change in the polarization direction to form the first light transmitting region and the second light transmitting region. A specific coating position can be determined according to a requirement of a change in the polarization direction of the laser light beam.

Further, in another implementation, a non-polarity conversion element may also be a diffusion sheet material in addition to the flat sheet glass, so that the laser light beams can be homogenized while transmitting through.

In one embodiment, a plurality of light transmitting units are adhered to the window bracket 0221 to form a pane-shaped light transmitting layer structure. In a cross-sectional diagram of a packaged structure of laser array as shown in FIG. 5, a light transmitting portion of a light transmitting layer structure is covered in a light emitting direction of the light emitting chips, and an edge portion thereof may be fixed to the metal substrate by means of soldering or gluing. Specifically, the window bracket and the metal substrate may be fixed by means of resistance welding to form a sealed space. The above light emitting chips are included in the sealed space, thereby protecting the light emitting chips and allowing for a dustproof isolation. Optionally, the sealed space is filled with nitrogen gas to further prevent oxidation of the light emitting chips and improve performance and service life of the laser.

The first light transmitting region and the second light transmitting region of the light transmitting portion respectively include a plurality of first light transmitting units and a plurality of second light transmitting units, the plurality of first light transmitting units, and the plurality of second light transmitting units are adhered in windows 0222 formed by the window bracket 0221. In one implementation, in the laser array, the number of the plurality of light emitting chips is the same as a sum of the plurality of first light transmitting units and the plurality of second light transmitting units, that is, a light beam emitted by each of the laser light emitting chip corresponds to one light transmitting unit, and transmits through the light transmitting unit. For example, when the laser array includes 20 lasers, that is, 20 light emitting chips, a sum of the number of the first light transmitting units and the number of the second light transmitting units is also 20, and each first light transmitting unit or each second light transmitting unit faces a light exiting direction of a certain light emitting chip.

Of course, light beams emitted by several laser light emitting chips may enter alight transmitting unit, that is, a sum number of the first light transmitting units and the second light transmitting is inconsistent with the number of the laser light emitting chips. For example, when the laser array includes 20 light emitting chips, the number of the first light transmitting units may be set to five, and the number of the second light transmitting units is set to five, so that there is a total of ten light transmitting units, and laser light beams emitted by every two laser light emitting chips may enter one light transmitting unit.

When the total number of light transmitting units and the total number of the laser light emitting chips are the same, a plurality of laser light beams having different polarization directions can be divided more finely, so that the above laser light beams are mixed more uniformly, which is more beneficial for reducing the coherence.

In the following, an arrangement structure of the light transmitting units of the light transmitting portion will be described in detail with reference to the examples given in FIGS. 4A, 4B, 4C, and 4D. For simplicity, the description is made in combination with the laser array including 20 laser light emitting chips, which is arranged in a 4×5 array.

Figure 4A:
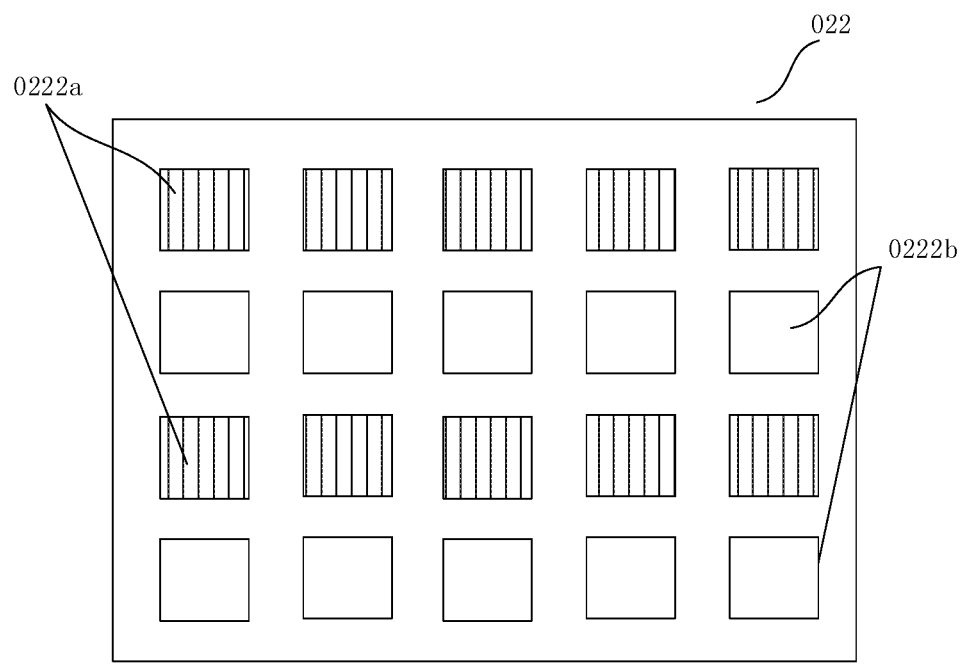
FIG. 4A is a schematic diagram of an arrangement of the light transmitting portion.

As shown in FIG. 4A, the light transmitting portion 022 includes a plurality of first light transmitting units 0222a which are represented by filling vertical lines in the figure and constitute a first light transmitting region, and a plurality of second light transmitting units 0222b which are represented by blank squares in the figure and constitute a second light transmitting region. In the example of FIG. 4A, laser light emitting chips (not shown) are arranged in an array to emit P-polarized light, where, by way of example, the first light transmitting units 0222a are half wave plates, and the second light transmitting units 0222b are flat glasses. After a plurality of laser light beams emitted by a light emitting portion pass through the first light transmitting region composed by the plurality of first light transmitting units 0222a, polarities thereof are reversed from the P-polarized light by 90 degrees to S-polarized light, and after a plurality of laser light beams emitted by the light emitting portion pass through the second light transmitting region composed by the plurality of second light transmitting units 0222b, since a flat glass does not change a polarity of a laser light beam, the plurality of laser light beams are still P-polarized light, that is, after the laser light beams emitted by the light emitting portion transmit through the first light transmitting region and the second light transmitting region, polarization directions of the output laser light beams of the first light transmitting region are different and perpendicular to the polarization directions of the output laser light beams of the second light transmitting region.

The flat glasses and the half wave plates may be of the same size. A thickness of the flat glass or half wave plate may be selected to be between 0.5 mm and 2 mm. For example, about 0.7 mm may be selected.

Taking the arrangement shown in FIG. 4A as an example, the plurality of first light transmitting units and second light transmitting units may be alternately arranged in row, and the first light transmitting region includes two rows of the first light transmitting units, and the second light transmitting region includes two rows of second light transmitting units, the laser light beams still maintain their original polarities after transmitting through the first light transmitting region, for example, may be P-polarized light, and the polarities of the laser light beams are reversed by 90 degrees after transmitting through the second light transmitting region, and change from P-polarized light to S-polarized light, then the P-polarized light and the S-polarized light in the laser light beams emitted from the laser array are alternately arranged, so the output laser light of the laser array is a mixed light of P-polarized light and S-polarized light. Simultaneous emission of light beams having different polarities is beneficial for reducing the coherence of the light beams.

In one implementation, when the number of rows of the laser array is even, the first light transmitting units and the second light transmitting units are alternately arranged in row, so that light amounts emitted from the P-polarized light and the S-polarized light are equivalent. A de-coherence effect is better because according to a definition of a speckle contrast:

$$C = \sqrt{\frac{\langle I^2 \rangle - \langle I \rangle^2}{\langle I \rangle}},$$

where I is an intensity of a plurality of speckle patterns, when there are N speckle patterns on a screen, during an integration period, the speckle contrast is reduced to $$1 \sim \frac{1}{\sqrt{N}}$$

of a speckle contrast at the time of static, and when the N speckle patterns are independent to each other, the speckle contrast is reduced to $$\frac{1}{\sqrt{N}}$$

of the speckle contrast at the time of static. In other cases, the speckle contrast is weakened to be between the above two values. When the speckle contrast is reduced to less than 4%, human eyes do not feel it.

For two light beams in different polarization states, when they are incident to scattering elements (speckle eliminating devices) of the same type, a probability of generating independent speckle patterns will increase greatly. According to the above formula, the speckle contrast will be close to $$\frac{1}{\sqrt{N}},$$

that is, toward a smaller speckle contrast, so that a better speckle eliminating effect can be obtained. For example, for two orthogonal light beams with different polarization directions, when they enter the scattering elements (speckle eliminating devices) of the same type, independent speckle patterns will be generated, where each pattern is one of two orthogonal polarization components. According to the above formula, if the two independent speckle patterns are of equal intensity, then N=2, the speckle contrast can be reduced to $1/\sqrt{2}$ of an original speckle contrast, and a better speckle eliminating effect is obtained.

Taking the arrangement shown in FIG. 4A as an example, the laser light beams in the first row and the second row have different polarities, the polarization directions thereof are perpendicular to each other, and the laser light beams in the second row and the third row also have different polarities, and the polarization directions thereof are perpendicular to each other. The same is true for the laser light beams of the third row and the fourth row, so that each two of the light beams emitted by the four rows of light emitting chips are opposite in polarity. According to the influence of the polarized light on the speckle contrast, the laser array according to the embodiment can emit laser light beams with a low coherence, thus achieving a better speckle eliminating effect when applied to a projection display.

Figure 4B:
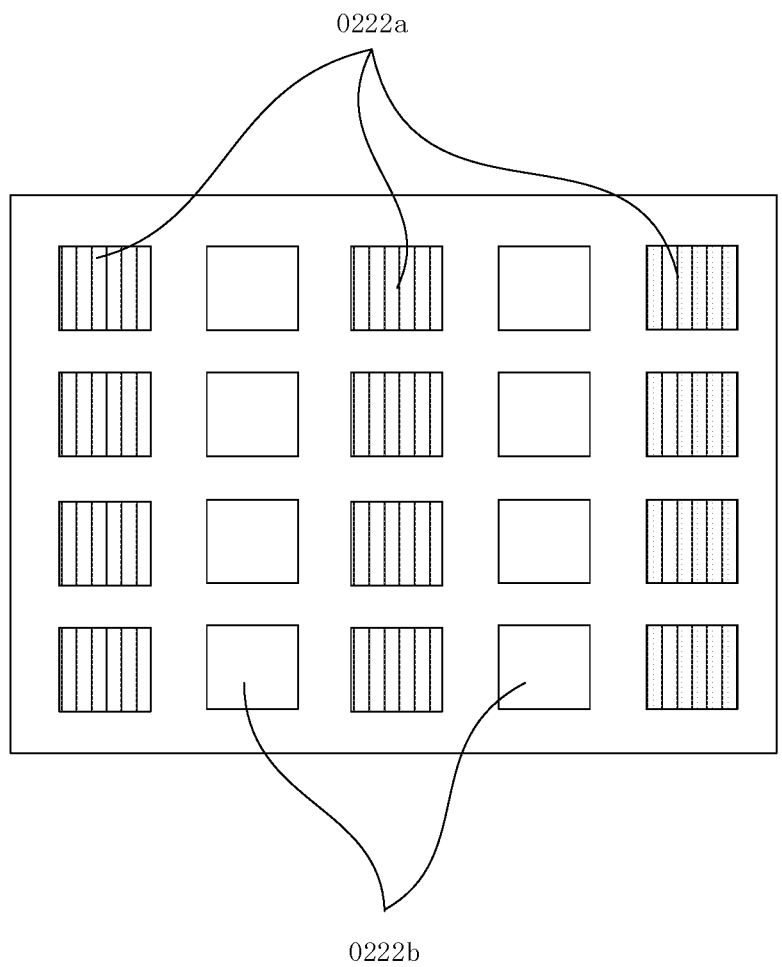
FIG. 4B is another schematic diagram of an arrangement of the light transmitting portion.

As shown in FIG. 4B, the plurality of first light transmitting units 0222a and second light transmitting units 0222b may also be alternately arranged in column, then the first light transmitting region includes three columns of first light transmitting units 0222a, and the first transmitting units may be flat glasses or diffusion sheets, the second light transmitting region includes two columns of second light transmitting units 0222b and the second light transmitting units may be half wave plates. Laser light beams, after transmitting through the first light transmitting units of the first light transmitting region, maintain their original polarities; and laser light beams, after transmitting through the second light transmitting units of the second light transmitting region, reverse by 90 degrees in polarity. For example, if the incident light beams are P-polarized light, the output light beams of the first transmitting region are still P-polarized light, while the output light beams of the second transmitting region change from the original P-polarized light to S-polarized light. So the P-polarized light and the S-polarized light in the laser light beams emitted from the laser array are alternately arranged, the laser light beams are mixed light of P-polarized light and S-polarized light. If each laser light emitting chip emits light at the same intensity, unlike the case shown in FIG. 4A, light intensities of P-polarized light and S-polarized lights are different, the light intensity of the P-polarized light is greater than the light intensity of the S-polarized light. The de-coherence effect is slightly worse than that of the case shown in FIG. 4A. Of course, it is also possible to obtain a better speckle eliminating effect by adjusting powers of the laser light emitting chips to make the light intensities of the P-polarized light and the S-polarized light equivalent.

In order to obtain a speckle contrast value as small as possible, light intensities of two kinds of light having different polarization directions may be made as equivalent as possible without changing light emitting powers of the laser light emitting chips. In an implementation, when the number of rows or columns of the laser array is even, the first light transmitting units and the second light transmitting units are alternately arranged in row or column.

Figure 4C:
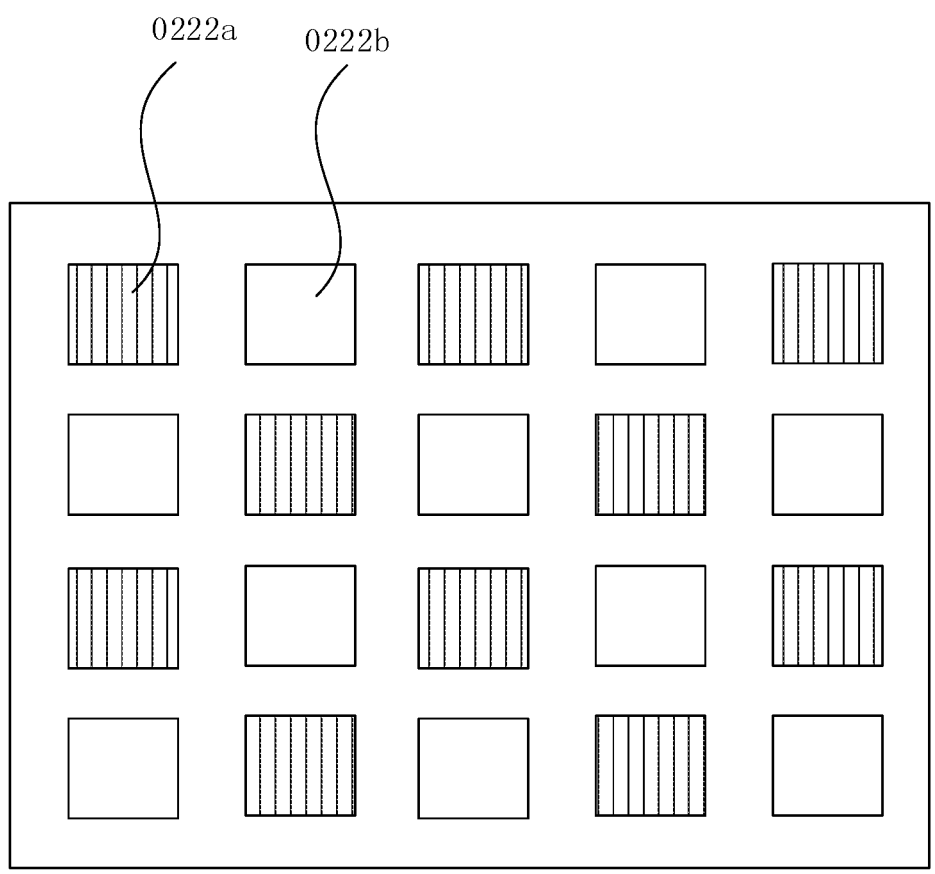
FIG. 4C is another schematic diagram of an arrangement of the light transmitting portion.

FIG. 4C shows an arrangement example of light transmitting units of another light transmitting portion. The first light transmitting units 0222a and the second light transmitting units 0222b are arranged in a checkerboard pattern, that is, every two of the first light transmitting unit and the second light transmitting unit are adjacent to each other. When the laser light emitting chips are arranged in a 4×5 array, the number of the first light transmitting units is 10, and the number of the second light transmitting units is also 10. When the laser light emitting chips emit P-polarized light, the first light transmitting units 0222a are flat glasses, and the second light transmitting units 0222b are half wave plates, the light beams of the laser light emitting chips transmitting through the first row of the light transmitting units are polarized lights of P, S, P, S, P, and the light beams transmitting through the second row of light transmitting units are polarized lights of S, P, S, P, S. The polarization of the light beams of the third row is the same with the first row and the polarization of the light beams of the fourth row is the same with the second row. With this arrangement, the P-polarized light beam and S-polarized light beam are placed adjacent to each other so that they can be mixed more evenly and the light intensities of the polarized components of the mixed light beams are equivalent. Therefore, coherence of the light beams of the adjacent light emitting chips, after passing through the light transmitting portion, is reduced, thereby being beneficial for reducing the speckle effect when the laser projection display is performed.

Figure 4D:
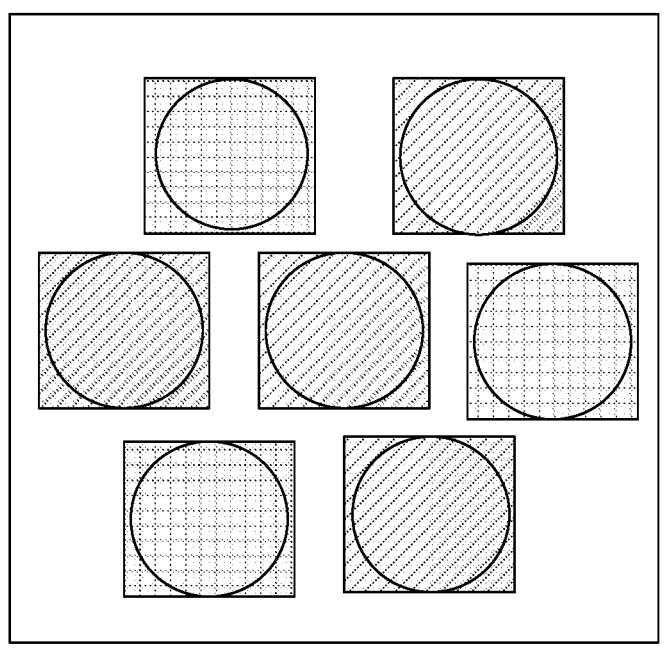

In another embodiment, when the laser light emitting chips are not arranged in a regular row and column manner, such as the situation shown in FIG. 4D, the arrangement of the laser light emitting chips may be compact, which is beneficial for reducing a volume. Checkered patterns in the figure represent the first light transmitting units, slant shaded patterns represent the second light transmitting units. In an implementation, the arrangement is in such a manner that each of the first light transmitting units and each of the second light transmitting units are adjacent to each other. In this way, the light transmitting units adjacent to each other can respectively emit laser light beams with different polarization directions, and distributions of the P-polarized lights and the S-polarized lights are evenly allocated, so that the light intensities of the P-polarized lights and the S-polarized lights are equivalent, and a degree of mixing and homogenization is high.

Those skilled in the art can understand that, based on the above distribution principle, on considering a convenience of processing, it is preferred that, when the number of rows or the number of columns is even, the first light transmitting units and the second light transmitting units are alternately arranged in row or column; when the laser light emitting chips are not arranged in a regular row and column manner, every two of the first light transmitting unit and the second light transmitting unit are arranged adjacent to each other, so that the numbers of the two light transmitting units are as equivalent as possible.

In summary, in the several arrangements of the light transmitting portion illustrated in FIGS. 4A to 4D, since different regions of the light transmitting portion perform different processing for the laser light beams, one region may allow the laser lights to emit according to their original polarization directions, the other region may change the polarization directions of the laser light beams. Therefore, when the laser light emitting chips transmit through the light transmitting portion to form a mixed light beam of the laser light beams with different polarization directions, since the polarization directions are different, it is of a high probability that two laser light beams having equivalent light intensities may form multiple independent speckle patterns, which is beneficial for eliminating a speckle, thereby reducing coherence of the laser light beams emitted by the laser array.

In the above examples, a quarter wave plate may also be selected as the first light transmitting unit, and a flat glass or a diffuser material may also be selected as the second light transmitting unit. Then, laser light beams convert from linearly polarized light to circularly polarized lights after transmitting through the first light transmitting units, and laser light beams maintain the original linear polarization direction after transmitting through the second light transmitting units, thereby the output laser light beams emitted from a laser array have plurality of polarization directions, and coherence therebetween is reduced to some extent.

It should be noted that, in the above examples, the fact that the first light transmitting units, the first light transmitting region, the second light transmitting units, the second light transmitting region, and the laser light emit chips emitting P-polarized lights, S-polarized lights or circularly polarized lights does not form limitations to the laser array, but simply to clarify particular implementations. In implementations, those skilled in the art can understand that the material selecting for the first light transmitting units and the second light transmitting units is not limited to the examples of the embodiment, and the two can be interchanged.

Besides, since the laser light beams emitted by the laser light emitting chips have different divergence angles in a fast axis and a slow axis, the laser light beams actually have relatively large divergence states in a direction of the fast axis, for example, diverging at 30 degrees, and the divergence angle along the slow axis is simply 8 to 10 degrees. However, as a laser array component, it is theoretically expected to emit relatively parallel light beams. Therefore, the light beams emitted by the laser light emitting chips need to be collimated, and the collimated light beams are emitted in a substantially parallel state, which is beneficial for a subsequent optical path design. In a specific implementation, microlens may be directly disposed above the laser light emitting chips as collimating mirrors, and then packaged. For example, an outermost layer of the laser array is provided with a light transmitting layer for being sealingly connected to the metal substrate, and the light emitting chips and the microlens are accommodated in the sealed space.

Figure 2B:
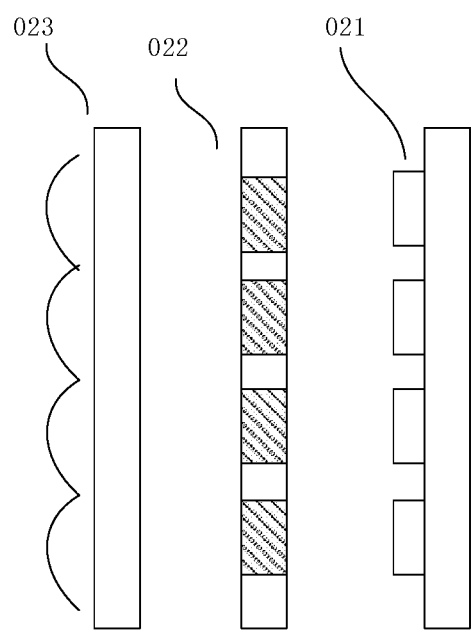
FIG. 2B is a schematic cross-sectional view of another laser array.

Referring to FIG. 2B, a collimating portion 023 is disposed on a light emitting edge of the light transmitting portion 022. The collimating portion 023 is a collimating lens set composed of a plurality of lens unit structures, and can collimate and converge the light beams.

Figure 6:
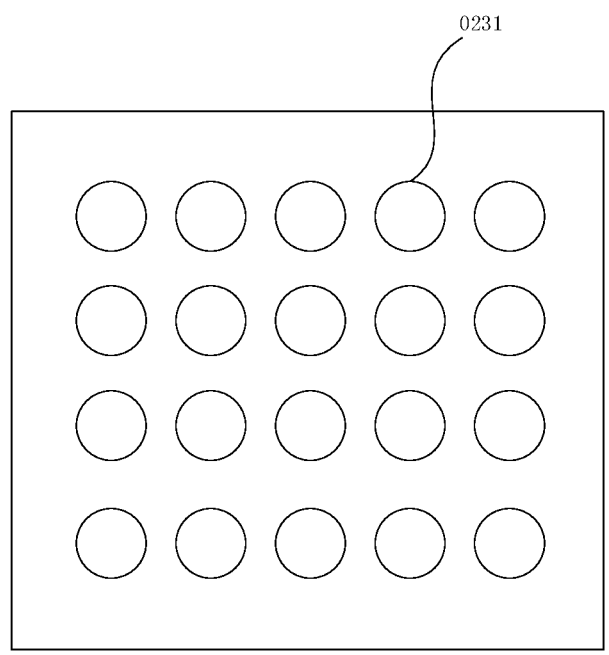
FIG. 6 is a schematic diagram of an arrangement of a collimating portion.

Referring to FIG. 6, the collimating lens set includes a plurality of collimating lens units 0231, and the number of the plurality of collimating lens units 0231 is the same as the number of the light emitting chips or the number of the light transmitting units of the light transmitting portion, that is, one collimating lens unit corresponds to one light transmitting unit of the light transmitting portion, and corresponds to one light emitting chip, and is configured to collimate a laser light beam emitted by the corresponding light emitting chip and transmitting through the first light transmitting unit or the second light transmitting unit. The collimating lens set is disposed in a light emitting direction of the laser light beams. In practical disclosures, a plurality of collimating lens units may be arranged in an array, such as be made as an array of fly-eye lenses.

Optionally, the collimating lens set may be integrally formed into a whole component, so as to cover the light emitting direction of the light emitting chips or a light emitting direction of a reflecting portion; or each of the collimating lens set may be separately disposed and separately covers the light emitting direction of the light emitting chips or the light emitting direction of the reflecting portion. A material of the collimating lens set may be selected from B270, K9, an optical glass material with high transmittance and high hardness.

Referring to FIG. 5, it is a schematic diagram of a packaged structure of a laser array, in which a collimating portion 053 is further provided at an outermost side of the laser array. Specifically, the collimating portion 053 is a fly-eye lens array. Peripheral edge portions of the collimating portion 053 are adhered to peripheral portions of the light transmitting portion 052 or the metal substrate 0512 by UV glue to form a packaged laser array. After packaging, the light emitting chips (not shown) are enclosed in a sealed space enclosed by the light transmitting portion 052 and the metal substrate 0512. A pin 0514 is extracted out from a side of the metal substrate.

In one embodiment, the light emitting chips may be directly welded to the metal substrate through soldering. Alternatively, as shown in FIG. 3A, the light emitting chip 0211 may also be connected to the metal substrate 0212 through a heat sink 0213. The light emitting chip 0211 is first fixedly connected to one side of the heat sink 0213 by means of welding or adhering of thermally conductive adhesive, and the other side of the heat sink 0213 is fixedly connected to the metal substrate 0212 by means of welding or adhering of thermally conductive adhesive.

It should be noted that the connection manner of the light emitting chip and the metal substrate is not particularly limited, and may be performed by means of welding, or by means of adhering of thermally conductive adhesive, as long as the connection manner does not greatly affect the thermal conduction.

The light emitting chips may be connected in series by electrical connection. Specifically, each light emitting chip may be connected with a gold wire, and the gold wire is finally connected to a pin to realize power-on of each light emitting chip. Optionally, the gold wire can be fixed on the metal substrate by gluing.

In an implementation, the metal substrate in the laser array is a copper substrate, which has a good thermal conductivity and a thickness selected from a range of 1 mm to 3 mm.

In an implementation, the light beams emitted by the light emitting chips in the laser array may all be blue, green, or red; or some of the light emitting chips emit blue lights, and another part of the light emitting chips emit red or green lights; or some of the light emitting chips emit blue lights, some of the light emitting chips emit red lights, and some of the light emitting chips emit green lights.

In an implementation of the present disclosure, if a plurality of light emitting chips in the laser array emit lights of the same color, regardless of they are blue, red or green, wavelengths of light beams emitted by adjacent light emitting chips in the plurality of light emitting chips are different, that is, there is a wavelength difference. Such design can greatly reduce a temporal coherence effect between adjacent laser light beams and reduce the speckle effect of the laser display. In the present embodiment, the wavelength difference is preferably at least 1 nm, and further preferably 2 nm.

When the light emitting chips emit blue laser lights or red laser lights, light emitting chips emitting blue laser lights and light emitting chips emitting red laser lights follow the same arrangement rule as the first light transmitting units and the second light transmitting units. In this way, the blue laser lights and the red laser lights not only have different wavelengths, but also have different polarization polarities, which is beneficial for eliminating the speckle in terms of temporal coherence and spatial coherence.

Figure 7A:
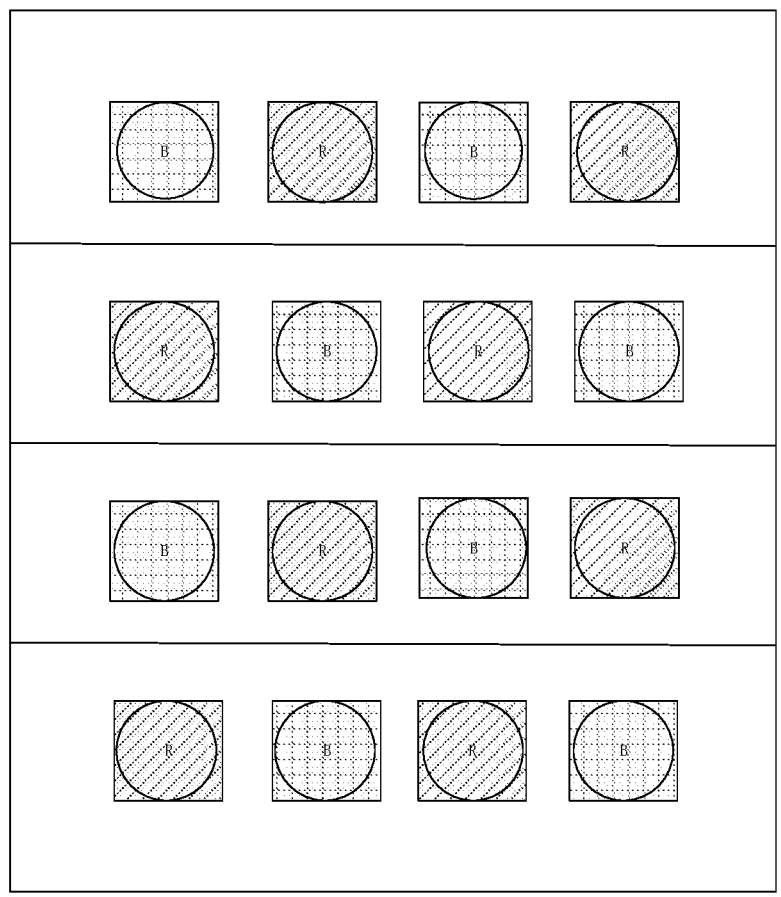
FIG. 7A is a schematic front view of a laser array.

As shown in FIG. 7A, a schematic structural diagram of a light emitting surface of a two-color laser array is shown, where the red laser light emitting chips and the blue light emitting chips may be arranged adjacent to each other, and the first light transmitting units and the second light transmitting units respectively cover light emitting surfaces of the blue laser light emitting chips and the red laser light emitting chips, which are also spaced at regular intervals from each other. Taking it as an example where the first light transmitting units are half wave plates, and the second light transmitting units are flat glasses, the first light transmitting units in the first row and the third row respectively transmit blue laser lights normally, and the second light transmitting units in the second row and the fourth row transmit red laser lights whose polarities are reversed.

Of course, the red laser light emitting chips and the blue laser light emitting chips may also be alternately arranged in row or column. For example, a first row and a third row are arranged with the blue laser light emitting chips, a second row and a fourth row are arranged with the red laser light emitting chips, and the first light transmitting units and the second light transmitting units are not arranged in row or column, but every two of the first light transmitting unit and the second light transmitting unit are arranged adjacent to each other according to a checkerboard, so that a plurality of laser light beams having different wavelengths and different polarities, and a plurality of laser light beams having even the same wavelength but different polarities may be obtained. In this way, a speckle contrast of the laser light beams in the polarization direction can also be reduced, and a better speckle eliminating effect is obtained.

Figure 7B:
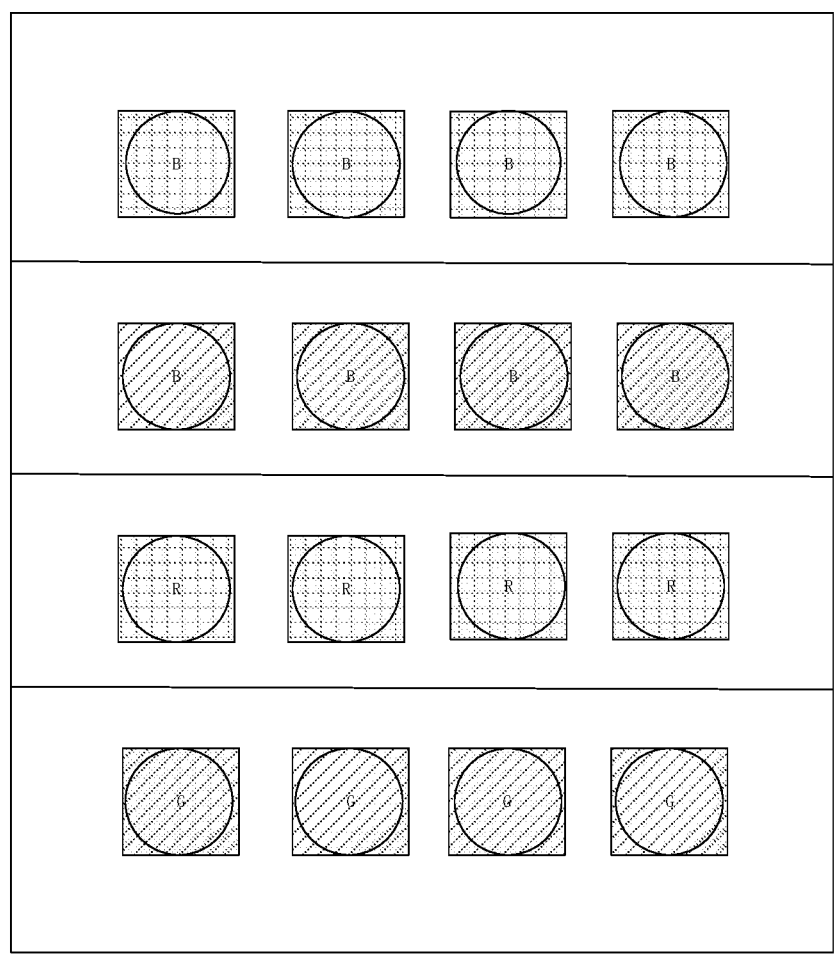
FIG. 7B is a schematic front view of a laser array.

As shown in FIG. 7B, a schematic structural diagram of a light emitting surface of a three-color laser array is shown, where there are three-color laser light emitting chips of red, green, and blue among a plurality of light emitting chips arranged in an array, a first row and a second row are arranged with the blue laser light emitting chips, a third row is arranged with the red laser light emitting chips, and a fourth row is arranged with the green laser light emitting chips, the first row and the third row are provided with first light transmitting units, the second row and the fourth row are provided with second light transmitting units, such that blue laser lights transmitting through the light transmitting units in the first row and the second row have different polarities, the blue laser lights transmitting through the light transmitting units in the second row and the red laser lights transmitting through the light transmitting units in the third row have different polarities, and the red laser lights transmitting through the light transmitting units in the third row and the green laser lights transmitting through the light transmitting units in the fourth row also have different polarities, so that the entire laser array can emit a plurality of laser light beams having different wavelengths and different polarities.

The multi-color laser array in the above embodiment can emit laser light beams of various wavelengths and different polarities, and based on the principle of reducing the speckle contrast by the above polarized lights, the speckle effect of the laser light beams can also be reduced, which is not repeat herein again.

Figure 8:
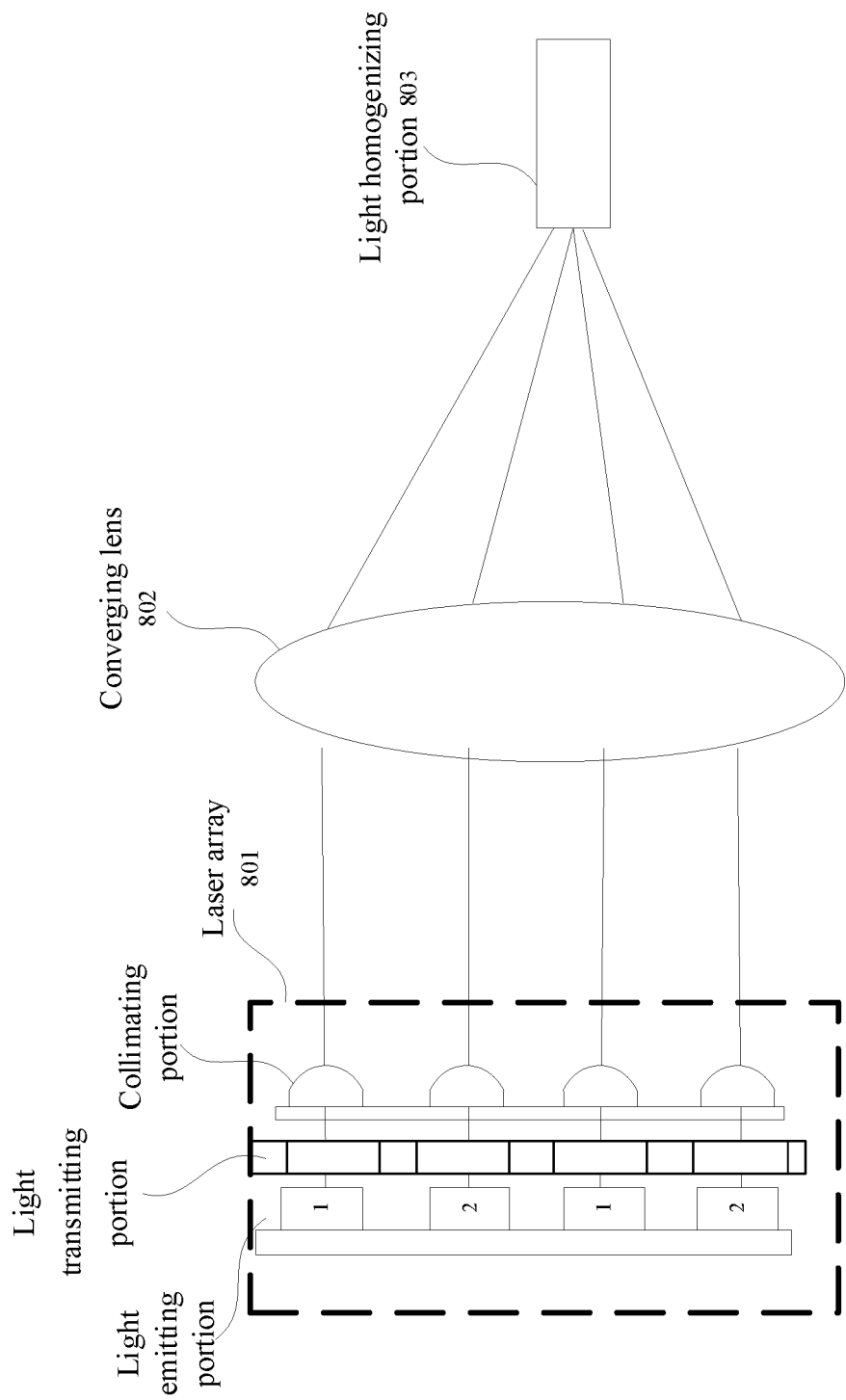
FIG. 8 is a schematic structural diagram of a laser source.

The present disclosure further provides a laser source. As shown in FIG. 8, it includes a laser array 801 and a converging lens 802. The converging lens 802 converges and shapes laser light beams emitted by the laser array 801 to form an illumination light beam, which then enters an optical machine after being homogenized by a light homogenizing portion 803. The light homogenizing portion 803 may be a light pipe or a fly eye lens. The shaped laser light beam, before entering the light homogenizing portion 803, or after being homogenized by the homogenizing portion 803, may pass through, for example, a moving diffusion wheel, a diffusion sheet, or a phase adjusting device, for eliminating a speckle.

The laser array 801 in the embodiment may be an example of any laser array in the embodiments. Thanks to the use of the laser array, a coherent characteristic or a speckle effect of the laser light beams can be suppressed from the source, and a high-quality illumination light beam is provided. More importantly, a usage of a speckle eliminating component in an optical path can be greatly simplified, the optical path architecture can be simplified, thereby facilitating miniaturization.

Figure 9:
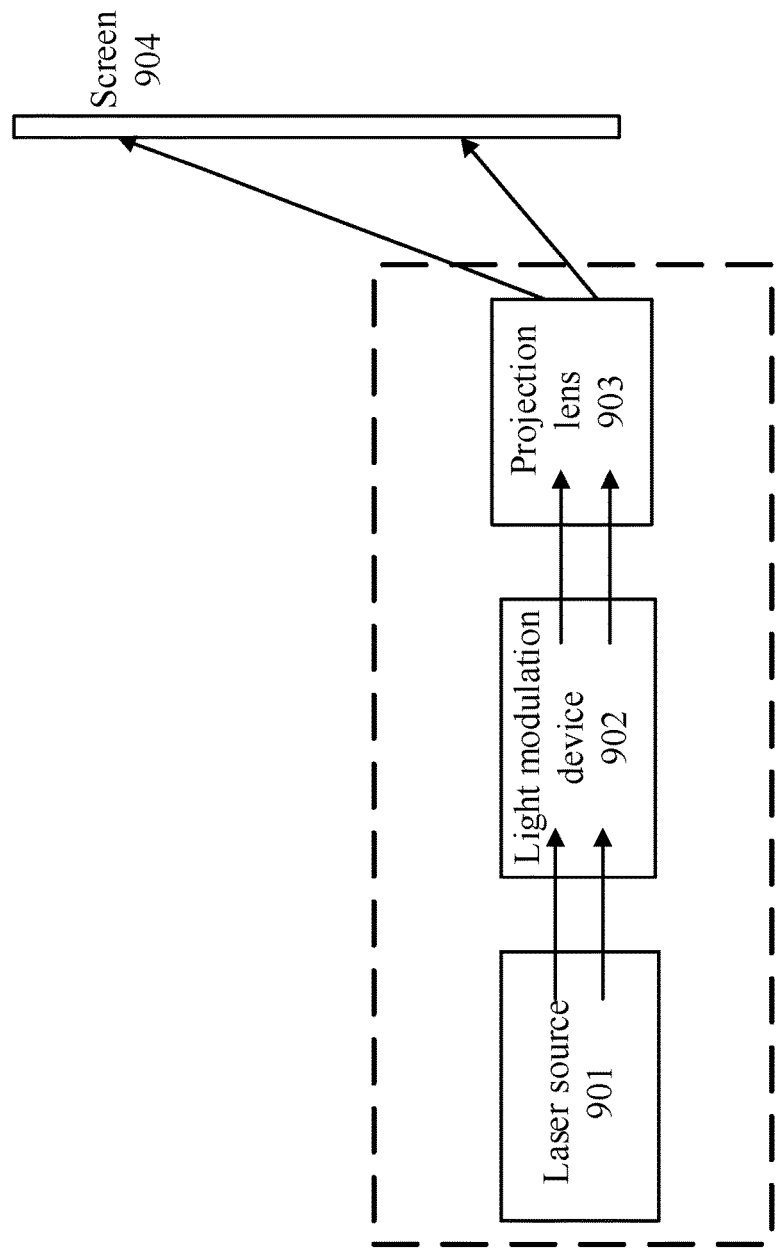
FIG. 9 is a schematic structural diagram of a laser projection device.

The present disclosure further provides a laser projection device. As shown in FIG. 9, it includes a laser source 901, a light modulation device 902, and a projection lens 903. The laser source 901 emits laser light beams to form a light beam for irradiating to the light modulation device 902, and specifically, for irradiating on the light modulation device 902. In a digital light processing (DLP) architecture, the light modulation device 902 may be specifically a digital micromirror array, including millions of tiny mirrors. The light modulation device 902 modulates the light beam according to a driving signal corresponding to an image display signal, and the modulated light beam enters the projection lens for imaging. The laser source is the laser source in the above embodiments. The laser projection device provided in the embodiment may be a laser projector, a laser projection television, where the laser source can provide a high-quality light beam, reduce a speckle effect, and, meanwhile, facilitate simplification of an optical architecture, and realize miniaturization of the laser projection device.

In the description of the specification, specific features, structures, materials or characteristics may be combined in any suitable manner in any one or more embodiments or examples.

The foregoing is only a specific embodiment of the present disclosure, but the protection scope of the present disclosure is not limited thereto, and any person skilled in the art can easily think of the fact that changes or substitutions within the technical scope disclosed in the present disclosure should be covered by the protection scope of the present disclosure. Therefore, the protection scope of the present disclosure should be subject to the protection scope of the claims.

What is claimed is:

1. A laser array, comprising:
   a light emitting portion for emitting a laser light beam, wherein the light emitting portion comprises a plurality of light emitting chips for emitting the laser light beam and a metal substrate, and the light emitting chips are disposed on the metal substrate; and
   a light transmitting portion disposed along a light emitting direction of the light emitting portion for transmitting the laser light beam;
   wherein the light transmitting portion comprises a first light transmitting region and a second light transmitting region, the first light transmitting region and the second light transmitting region are disposed such that light beams transmitting through the two regions have different polarization directions;
   wherein the light transmitting portion is enclosed with the metal substrate to form a sealed space, and the light emitting chips are sealed in the sealed space;
   wherein the first light transmitting region comprises a plurality rows of first light transmitting units, the second light transmitting region comprises a plurality rows of second light transmitting units, the plurality rows of first light transmitting units and the plurality rows of second light transmitting units are alternately arranged in row.

2. The laser array according to claim 1, wherein the first light transmitting region and the second light transmitting region are disposed such that polarization directions of the light beams transmitting through the two regions are orthogonal.

3. The laser array according to claim 2, wherein one of the first light transmitting region and the second light transmitting region is a flat glass or a diffusion sheet, and the other is a half wave plate.

4. The laser array according to claim 1, wherein the first light transmitting region and the second light transmitting region are disposed such that the light beams transmitting through the two regions are a linearly polarized light and a circularly polarized light, respectively.

5. The laser array according to claim 4, wherein one of the first light transmitting region and the second light transmitting region is a flat glass or a diffusion sheet, and the other is a quarter wave plate.

6. The laser array according to claim 1, wherein the light transmitting portion comprises a window bracket, and the plurality rows of first light transmitting units and the plurality rows of second light transmitting units are adhered to the window bracket; or
   the light transmitting portion comprises a light transmitting glass plate, and the light transmitting glass plate are coated region by region to form the first light transmitting region and the second light transmitting region.

7. The laser array according to claim 6, wherein the first light transmitting units and the second light transmitting units have a curvature of zero.

8. The laser array according to claim 7, wherein one of the first light transmitting region and the second light transmitting region is provided with a polarity switching component.

9. The laser array according to claim 1, further comprising a collimating portion that comprises a plurality of collimating lens units, and the number of the collimating lens units and the number of the light emitting chips are consistent.

10. The laser array according to claim 1, wherein the light emitting chips are arranged in a row and column array.

11. The laser array according to claim 1, wherein the color of the light beams emitted by the light emitting chips is at least one of blue, green, and red.

12. A laser source, comprising the laser array according to claim 1, and a convergence shaping member that converges and shapes a laser light beam emitted by the laser array to form an illumination light beam.

13. The laser source according to claim 1, wherein the first light transmitting region and the second light transmitting region are disposed such that polarization directions of the light beams transmitted through the first light transmitting region and the second transmitting region are orthogonal; or,
 the first light transmitting region and the second light transmitting region are disposed such that the light beams transmitting through the two regions are a linearly polarized light and a circularly polarized light, respectively.

14. The laser array according to claim 1, wherein each of the plurality rows of first light transmitting units and correspondingly adjacent one row of second light transmitting unit have different polarities of laser light beams, and polarization directions thereof are perpendicular to each other.

15. A laser projection device, comprising:
 a laser source for emitting laser light beam to form a light beam;
 a light modulation device configured to receive the light beam and modulate the light beam according to a driving signal corresponding to an image display signal; and
 a projection lens configured to receive the modulated light beam from the light modulation device to image;
 wherein the laser array comprises:
 a light emitting portion for emitting a laser light beam, wherein the light emitting portion comprises a plurality of light emitting chips for emitting the laser light beam and a metal substrate, and the light emitting chips are disposed on the metal substrate; and
 a light transmitting portion disposed along a light emitting direction of the light emitting portion for transmitting the laser light beam;
 wherein the light transmitting portion comprises a first light transmitting region and a second light transmitting region, and light beams transmitting through the two regions have different polarization directions;
 wherein the light transmitting portion is enclosed with the metal substrate to form a sealed space, and the light emitting chips are sealed in the sealed space;
 wherein the first light transmitting region comprises a plurality rows of first light transmitting units, the second light transmitting region comprises a plurality rows of second light transmitting units, the plurality rows of first light transmitting units and the plurality rows of second light transmitting units are alternately arranged in row.

* * * * *